United States Patent
Castro

(10) Patent No.: US 11,848,072 B2
(45) Date of Patent: *Dec. 19, 2023

(54) EDGELESS MEMORY CLUSTERS

(71) Applicant: Micron Technology, Inc., Boise, ID (US)

(72) Inventor: Hernan A. Castro, Shingle Springs, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/950,895

(22) Filed: Sep. 22, 2022

(65) Prior Publication Data

US 2023/0126926 A1    Apr. 27, 2023

Related U.S. Application Data

(63) Continuation of application No. 17/385,682, filed on Jul. 26, 2021, now Pat. No. 11,482,266.

(51) Int. Cl.
| | |
|---|---|
| *G11C 8/12* | (2006.01) |
| *H03K 19/1776* | (2020.01) |
| *G11C 5/02* | (2006.01) |
| *G11C 8/10* | (2006.01) |

(52) U.S. Cl.
CPC ............... *G11C 8/12* (2013.01); *G11C 5/025* (2013.01); *G11C 8/10* (2013.01); *H03K 19/1776* (2013.01)

(58) Field of Classification Search
CPC .. G11C 8/12; G11C 5/025; G11C 8/10; H03K 19/1776

USPC ..................................................... 365/230.03
See application file for complete search history.

(56) References Cited

U.S. PATENT DOCUMENTS

| | | | |
|---|---|---|---|
| 7,242,216 B1 | 7/2007 | Schmit et al. | |
| 8,891,280 B2 | 11/2014 | Castro et al. | |
| 9,025,398 B2 | 5/2015 | Flores et al. | |
| 9,224,635 B2 | 12/2015 | Pellizzer et al. | |
| 9,792,958 B1 | 10/2017 | Laurent | |
| 10,074,693 B2 | 9/2018 | Castro | |
| 10,347,333 B2 | 7/2019 | Laurent | |
| 11,482,266 B1 * | 10/2022 | Castro | G11C 5/025 |
| 2010/0096628 A1 | 4/2010 | Song et al. | |
| 2018/0240845 A1 | 8/2018 | Yang et al. | |
| 2019/0392885 A1 | 12/2019 | Bateman | |
| 2020/0194038 A1 | 6/2020 | Castro et al. | |
| 2021/0183441 A1 | 6/2021 | Laurent | |
| 2022/0101909 A1 * | 3/2022 | Waller | G11C 5/06 |

OTHER PUBLICATIONS

"International Search Report and Written Opinion of the International Searching Authority," issued in connection with Int'l Appl. No. PCT/US2022/073788 dated Nov. 2, 2022 (13 pages).

* cited by examiner

*Primary Examiner* — Huan Hoang
(74) *Attorney, Agent, or Firm* — Holland & Hart LLP

(57) ABSTRACT

Methods, systems, and devices for edgeless memory clusters are described. Systems, devices, and techniques are described for eliminating gaps between clusters by creating groups (e.g., domains) of clusters that are active at a given time, and using drivers within inactive clusters to perform array termination functions for abutting active clusters. Tiles on the edges of a cluster may have drivers that operate both for the cluster, and for a neighboring cluster, with circuits (e.g., a multiplexers) on the drivers to enable operations for both clusters.

20 Claims, 8 Drawing Sheets

EDGELESS MEMORY CLUSTERS

CROSS REFERENCE

The present Application for Patent is a continuation of U.S. patent application Ser. No. 17/385,682 by Castro, entitled "EDGELESS MEMORY CLUSTERS," filed Jul. 26, 2021, assigned to the assignee hereof, and is expressly incorporated by reference in its entirety herein.

FIELD OF TECHNOLOGY

The following relates generally to one or more systems for memory and more specifically to edgeless memory clusters.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

DETAILED DESCRIPTION

A quilt architecture has been used for some memories where the drivers are arranged in tiles underneath the memory cells. A group or array of memory that is decoded as a single group of memory cells may make up a cluster or partition. The cluster may include the tiles underneath the memory cells. In a cluster, the array of memory cells has breaks to allow for connections of electrodes to the drivers underneath, called socket connections. For this architecture, some of the electrodes contacting the memory cells associated with a tile may extend beyond the footprint of the tile to contact memory cells associated with a neighboring tile. Those memory cells may be attached to a driver on one of the neighboring tiles. In some cases, neighboring clusters have gaps between them to allow placement of array termination tiles, which include extra drivers for electrodes that have their socket connections outside the footprint of the cluster.

But the array termination tiles do not have associated memory cells, wasting that valuable space between neighboring clusters. Removing the array termination tiles (and thus the gap) between neighboring clusters would allow the neighboring clusters to be positioned closer together. However, that would remove the extra drivers for the electrodes that have their socket connections outside the cluster's footprint.

Systems, devices, and techniques are presented herein for edgeless memory clusters. In particular, systems, devices, and techniques are described for eliminating gaps between clusters by creating groups (e.g., domains) of clusters that are active at a given time, and using drivers within inactive clusters to perform array termination functions for abutting active clusters. Tiles on the edges of a cluster may have drivers that operate both for the cluster and for a neighboring cluster, with circuits (e.g., multiplexers) on the drivers to enable operations for both clusters.

Eliminating the gaps between clusters may achieve substantial reduction in die size. It may also reduce stress on the electrodes by reducing changes in density of the electrode layers.

Features of the disclosure are initially described in the context of memory systems and dies as described with reference to FIGS. 1 and 2. Features of the disclosure are further described in the context of arrays and systems as described with reference to FIGS. 3-5. These and other features of the disclosure are further illustrated by and described with reference to block diagrams, an apparatus diagram, and a flowchart that relate to edgeless memory clusters as described with references to FIGS. 4A-8.

Figure 1:
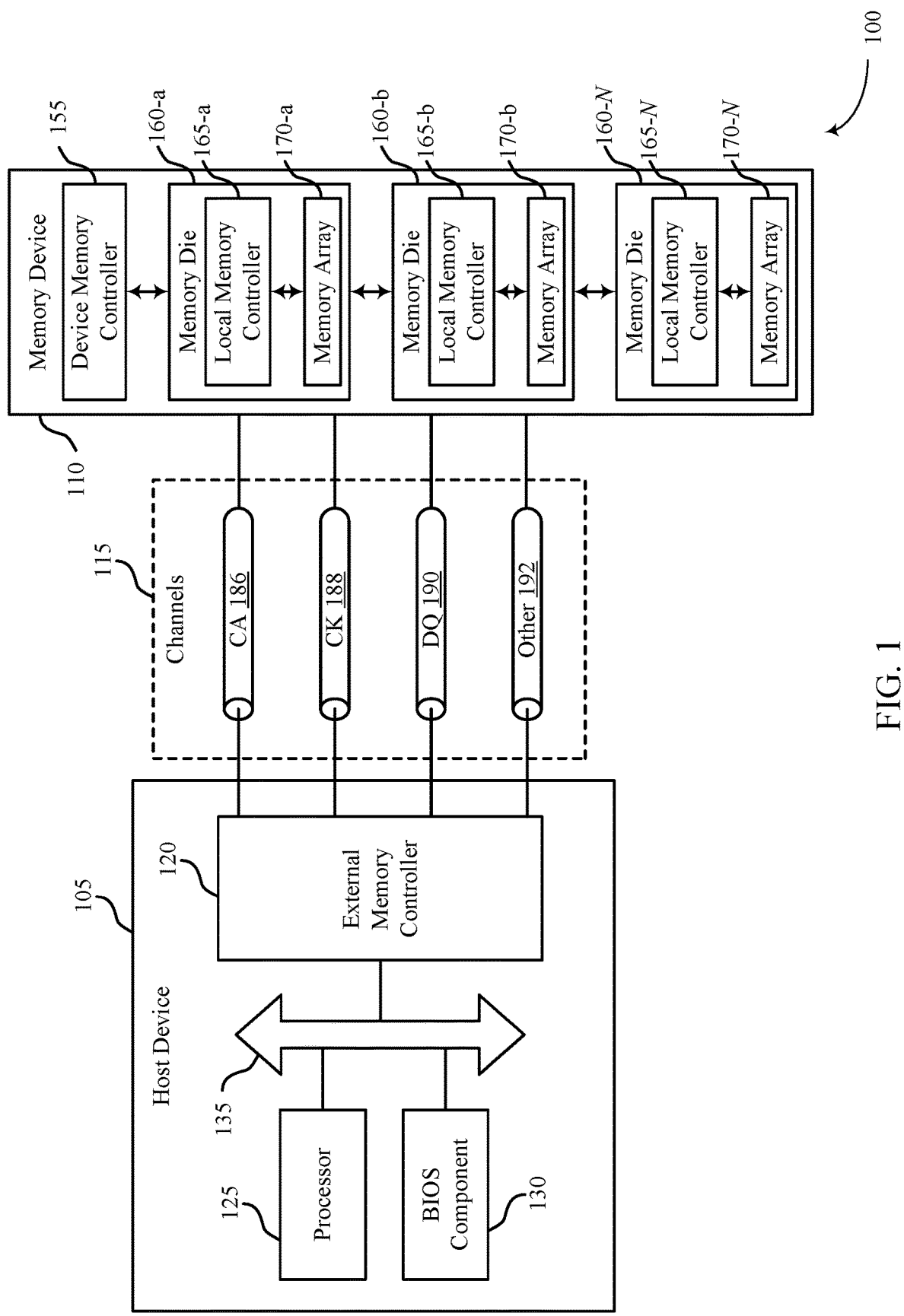
FIG. 1 illustrates an example of a system that supports edgeless memory clusters in accordance with examples as disclosed herein.

FIG. 1 illustrates an example of a system 100 that supports edgeless memory clusters in accordance with examples as disclosed herein. The system 100 may include a host device 105, a memory device 110, and a plurality of channels 115 coupling the host device 105 with the memory device 110. The system 100 may include one or more memory devices, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices 105. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory die 160 may include any quantity of stacked memory arrays 170 (e.g., two high, three high, four high, five high, six high, seven high, eight high). In some 3D memory dies 160, different decks may share at least one common access line such that some decks may share one or more of a row line or column line. In some 3D memory dies 160, common access lines may be shared by abutting clusters of memory arrays.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission media that carry information between the host device 105 and the memory device. Each channel 115 may include one or more signal paths or transmission media (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

Figure 2:
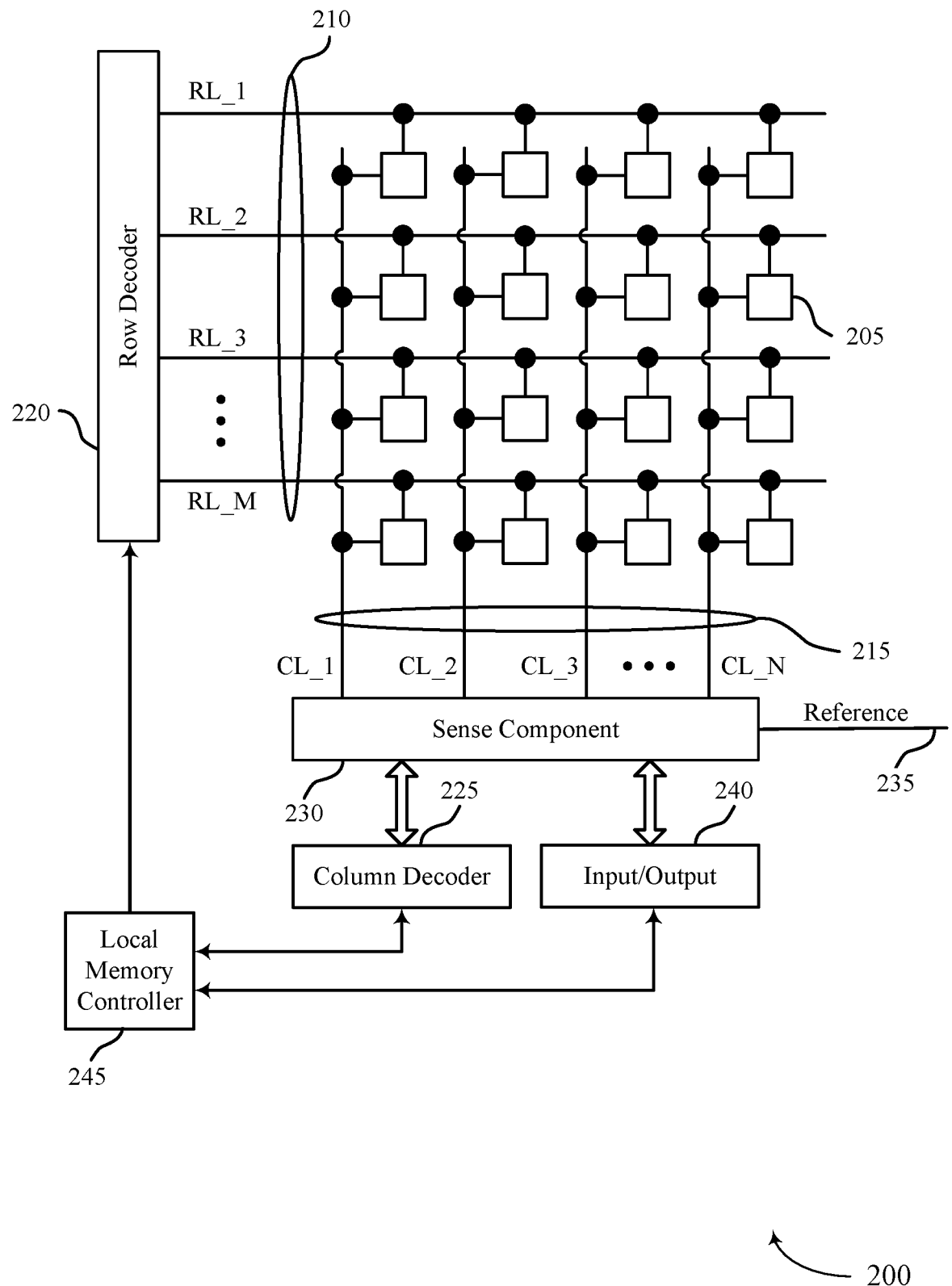
FIG. 2 illustrates an example of a memory die that supports edgeless memory clusters in accordance with examples as disclosed herein.

FIG. 2 illustrates an example of a memory die 200 that supports edgeless memory clusters in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell 205) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a logic state using a configurable material, which may be referred to as a memory element, a memory storage element, a material element, a material memory element, a material portion, or a polarity-written material portion, among others. A memory cell 205 may include a capacitor or other memory storage component to store a charge representative of the programmable states. For example, a charged and uncharged capacitor may represent two logic states, respectively, or a chalcogenide material may represent different states depending on its crystalline structure or other properties. A configurable material of a memory cell 205 may refer to a chalcogenide-based storage component. For example, a chalcogenide storage element may be used in a phase change memory (PCM) cell, a thresholding memory cell, or a self-selecting memory cell.

The memory die 200 may include the access lines (e.g., row lines 210 and the column lines 215) arranged in a pattern, such as a grid-like pattern. Access lines may be formed of one or more conductive materials. In some examples, row lines 210 may be referred to as word lines. In some examples, column lines 215 may be referred to as digit lines or bit lines. References to access lines, row lines, column lines, word lines, digit lines, or bit lines, or their analogues, are interchangeable without loss of understanding or operation. Memory cells 205 may be positioned at intersections of the row lines 210 and the column lines 215.

The memory die 200 may be arranged using a quilt architecture. In a quilt architecture, tiles with similar configurations of components may be arranged in an array. Memory devices built in such a manner may be expanded or contracted by adding or reducing tiles. The tiles may be building blocks for the memory die 200. Supporting circuitry (not shown) for the memory die may be positioned beneath the arrays of memory cells in tiles. As used herein a quilt architecture may refer to a memory array comprising a plurality of memory modules. For example, a memory die having a quilt architecture may comprise a repeating pattern of memory modules. In some examples, a memory module may include a tile and the circuitry and memory cells positioned on and above the tile.

In some examples of quilt architecture, some memory cells positioned above a tile may be addressed and accessed using support circuitry (not shown) positioned on a neighboring tile. Consequently, at the borders of the arrays of memory cells, some memory cells may not be addressable or accessible. To address these inaccessibility issues, boundary tiles may be positioned beyond the border of the array of memory cells to ensure the memory cells of the tiles are accessible.

Operations such as reading and writing, which may be referred to as access operations, may be performed on the memory cells 205 by activating or selecting access lines such as one or more of a row line 210 or a column line 215. By biasing a row line 210 and a column line 215 (e.g., applying a voltage to the row line 210 or the column line 215), a single memory cell 205 may be accessed at their intersection. The intersection of a row line 210 and a column line 215 in either a two-dimensional or three-dimensional configuration may be referred to as an address of a memory cell 205. An access line may be a conductive line coupled with a memory cell 205 and may be used to perform access operations on the memory cell 205.

Accessing the memory cells 205 may be controlled through a row decoder 220 or a column decoder 225. For example, a row decoder 220 may receive a row address from a local memory controller 245 and activate a row line 210 based on the received row address. A column decoder 225 may receive a column address from the local memory controller 245 and may activate a column line 215 based on the received column address. In a quilt architecture, the row decoder 220 and the column decoder 225 may be positioned on the tiles below the memory array. However, the row decoder 220 or the column decoder 225 or both may or may not be positioned on the tile positioned directly below the memory cell being accessed.

A sense component 230 may be operable to detect a state (e.g., a material state, a resistance, a threshold state) of a memory cell 205 and determine a logic state of the memory cell 205 based on the stored state. The sense component 230 may include one or more sense amplifiers to amplify or otherwise convert a signal resulting from accessing the memory cell 205. The sense component 230 may compare a signal detected from the memory cell 205 to a reference 235 (e.g., a reference voltage). The detected logic state of the memory cell 205 may be provided as an output of the sense component 230 (e.g., to an input/output 240), and may indicate the detected logic state to another component of a memory device that includes the memory die 200. In a quilt architecture, the sense component 230 may be positioned on the tiles below the memory array. However, the sense component 230 may or may not be positioned on the tile positioned directly below the memory cell being addressed.

The local memory controller 245 may control the accessing of memory cells 205 through the various components (e.g., row decoder 220, column decoder 225, sense component 230). The local memory controller 245 may be an example of the local memory controller 165 described with reference to FIG. 1. In some examples, one or more of the row decoder 220, column decoder 225, and sense component 230 may be co-located with the local memory controller 245. The local memory controller 245 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 245 may generate row signals and column address signals to activate the target row line 210 and the target column line 215. The local memory controller 245 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 245 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 245 in response to various access commands (e.g., from a host device 105). The local memory controller 245 may be operable to perform other access operations not listed here or other operations related to the operating of the memory die 200 that are not directly related to accessing the memory cells 205.

Figure 3:
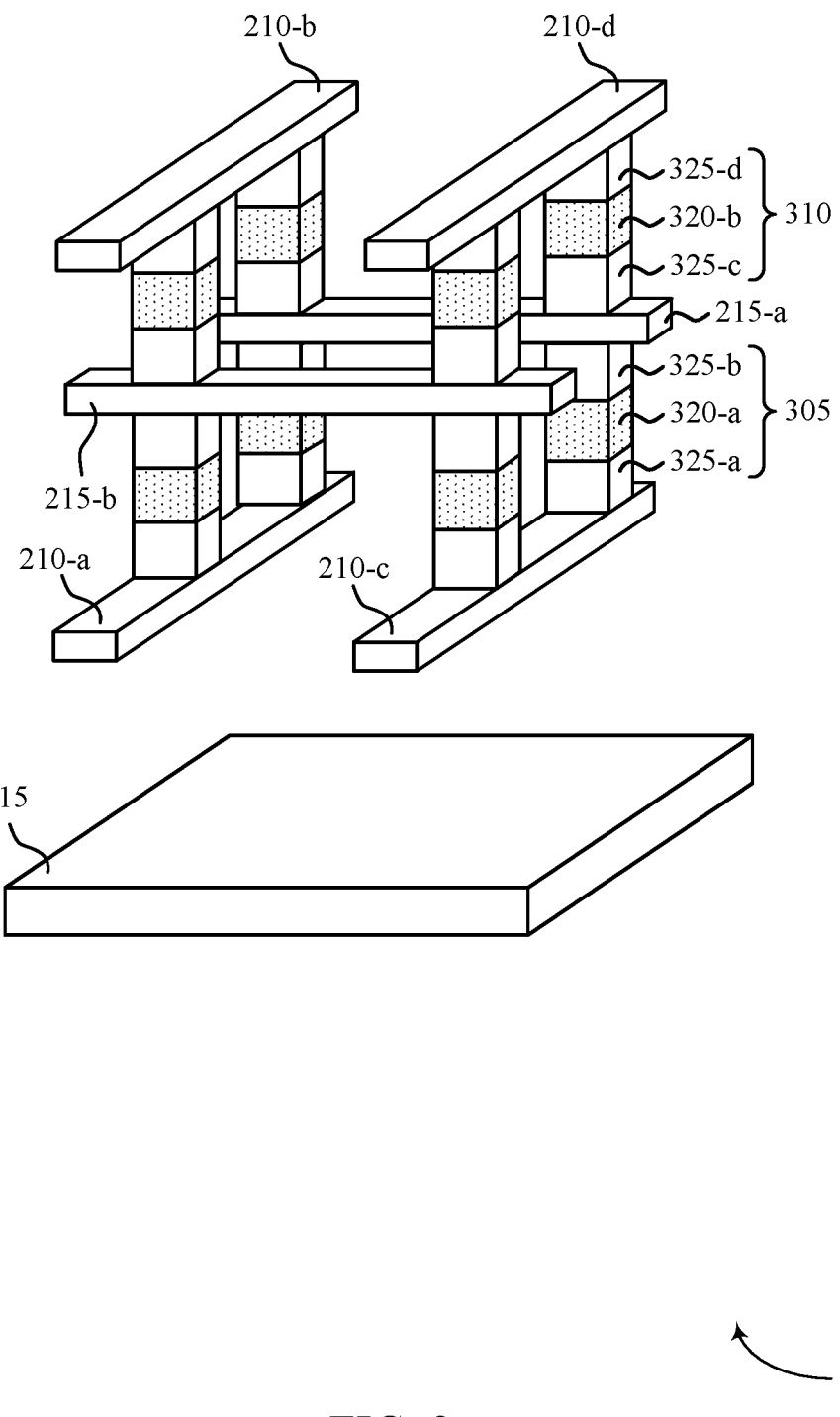
FIG. 3 illustrates an example of an array of memory cells that support edgeless memory clusters in accordance with examples as disclosed herein.

FIG. 3 illustrates an example of a memory array 300 in accordance with examples as disclosed herein. Memory array 300 may be an example of portions of the memory arrays or memory dies described with reference to FIGS. 1 and 2. The memory array 300 may include a first deck 305 of memory cells that is positioned above a substrate layer 315 and a second deck 310 of memory cells on top of the first array or deck 305. Though the example of memory array 300 includes two decks 305, 310, the memory array 300 may include any quantity of decks (e.g., one or more than two) positioned above the substrate layer 315. The memory array 300 may be included as part of a quilt architecture such that memory cells of portions of the memory array are positioned above substrate layer 315, which may include support components for accessing the memory cells, such as, e.g., decoders and amplifiers.

The memory cells of memory array 300 may include storage elements, electrodes, and/or selection elements. In some examples, a single component may act as both a storage element and a selection element. In the example shown in FIG. 3, one or more memory cells of the first deck 305 may include one or more of an electrode 325-*a*, a storage element 320-*a*, or an electrode 325-*b*. One or more memory cells of the second deck 310 may include an electrode 325-*c*, a storage element 320-*b*, and an electrode 325-*d*. In some cases, the storage elements 320 may be examples of a chalcogenide material, such as a phase change storage element, a thresholding storage element, or a self-selecting storage element. Although some elements included in FIG. 3 are labeled with a numeric indicator, other corresponding elements are not labeled, although they are the same or would be understood to be similar, in an effort to increase visibility and clarity of the depicted features.

Memory array 300 may also include row lines 210 (e.g., row lines 210-*a*, 210-*b*, 210-*c*, and 210-*d*), and column lines 215 (e.g., column lines 215-*a* and 215-*b*), which may be examples of row lines 210 and column lines 215, as described with reference to FIG. 2. One or more memory cells of the first deck 305 and the second deck 310 may include one or more chalcogenide materials in a pillar between access lines. For example, a single stack between access lines may include one or more of a first electrode, a first chalcogenide material (e.g., selector component), a second electrode, a second chalcogenide material (e.g., storage element), or a third electrode.

The memory cells of the first deck 305 and second deck 310 may, in some examples, have common conductive lines such that corresponding memory cells of one or more decks 305 and one or more decks 310 may share column lines 215 or row lines 210. For example, electrode 325-*c* of the second deck 310 and electrode 325-*b* of the first deck 305 may be coupled with column line 215-*a* such that the column line 215-*a* may be shared by vertically adjacent memory cells.

In some examples, the common conductive lines may couple with the support components for accessing the memory cells. For example, in a quilt architecture, the electrodes of a deck may correspond to row 210 and column lines 215 that extend horizontally. The electrodes may couple with corresponding drivers and decoders on tiles of the substrate layer 315 via vertical connectors (not shown) that extend downward through the decks.

In some examples, the material of the storage element 320 may include a chalcogenide material or other alloy including selenium (Se), tellurium (Te), arsenic (As), antimony (Sb), carbon (C), germanium (Ge), silicon (Si), or indium (IN), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (Cl), or fluorine (F), each in atomic or molecular forms.

In some examples, the storage element 320 may be an example of a phase change memory cell. In such examples, the material used in the storage element 320 may be based on an alloy (such as the alloys listed above) and may be operated so as to undergo a phase change or change to different physical state during normal operation of the memory cell. For example, a phase change memory cell may have an amorphous state (e.g., a relatively disordered atomic configuration) and a crystalline state (e.g., a relatively ordered atomic configuration) that may be used to indicate a logic state of the memory cell.

The architecture of memory array 300 may be referred to as a cross-point architecture, in some examples, in which a memory cell is formed at a topological cross-point between a row line 210 and a column line 215. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selector element. For example, DRAM may use a transistor, which is a three-terminal device, as the selector element for each memory cell and may have a larger memory cell area compared to the cross-point architecture.

While the example of FIG. 3 shows two memory decks, other configurations are possible. In some examples, a single memory deck of memory cells may be constructed above a substrate, which may be referred to as a two-dimensional memory. In some examples additional memory decks may be constructed above the two memory decks to form 3D vertical structures, with similarly alternating row lines and column lines. In some examples, two or more decks of memory cells may be configured in a similar manner in a three-dimensional cross point architecture. Further, in some cases, elements shown in or described with reference to FIG. 3 may be electrically coupled with one another as shown or described but rearranged physically (e.g., a storage element 320 and possibly a selection element or electrode 325 may be electrically in series between a row line 210 and a column line 215 but need not be in a pillar or stack configuration). In some examples, the layers or decks may be arranged vertically. That is, each memory deck may extend vertically and may be horizontally separated from each other.

A memory die may include a substrate layer and memory cells positioned above the substrate layer. The memory cells may be partitioned into memory clusters each having an array of memory cells that may be decoded as a single group of memory cells. Each memory cluster may include supporting circuitry for the array of memory cells, such as, e.g., drivers, decoders, and sense amplifiers. Each memory cluster may include tiles formed on a portion of the substrate layer and a portion of the array of memory cells formed above each tile. The supporting circuitry may be positioned within the tiles.

Figure 4A:
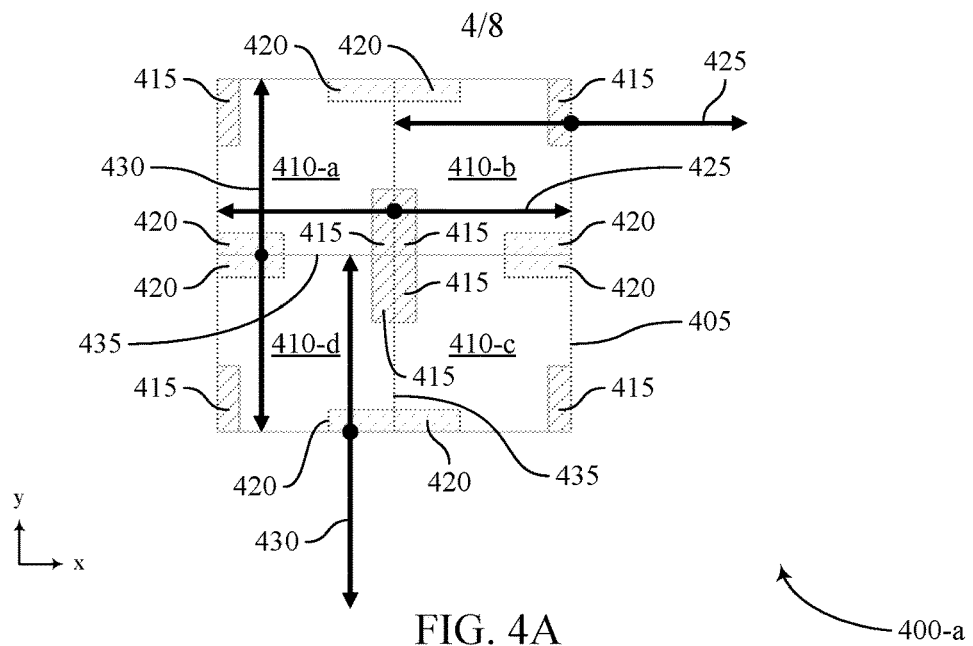
FIGS. 4A and 4B illustrate examples of memory modules that support edgeless memory clusters in accordance with examples as disclosed herein.
Figure 4B:
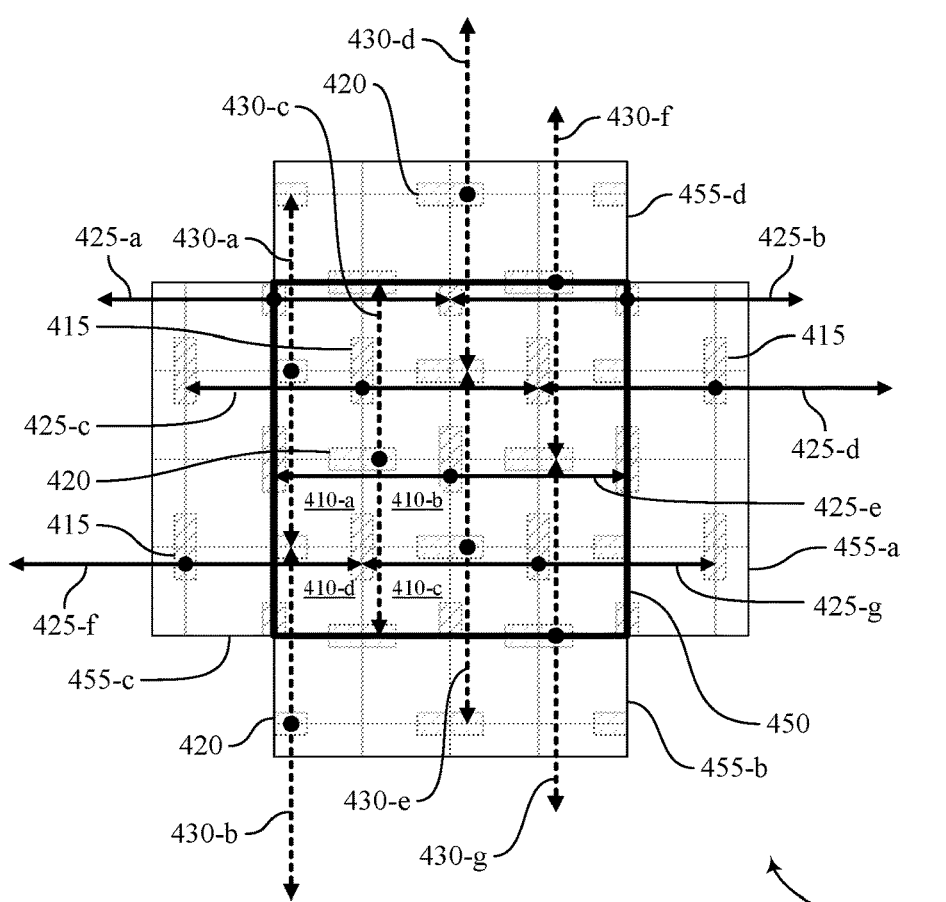

FIGS. 4A and 4B illustrate examples of memory modules 400-*a* and 400-*b* that support edgeless memory clusters in accordance with examples as disclosed herein. FIGS. 4A and 4B are examples of an architecture in which electrode drivers are distributed across a footprint of an active memory module. The memory modules may implement aspects of the system as described with reference to FIGS. 1-3. For example, memory modules 400-*a* and 400-*b* may be portions of memory arrays 170.

A memory array may include an array of memory cells positioned above a group of tiles. Each tile and the portion of the array of memory cells positioned above the tile (which may extend past the boundaries of the tile) may be considered to be a memory module. (In FIGS. 4A and 4B, the memory cells of the memory modules have been removed for the sake of clarity). The memory modules may be used as part of a quilt architecture. In a quilt architecture a plurality of tiles that have a common configuration of components (e.g., drivers) may be arranged in an array. As discussed in more detail with reference to FIG. 5, the tiles may be arranged in a repeating pattern.

The memory module 400-*a* illustrated in FIG. 4A may include a tile 405 formed on a substrate, according to one example. The tile 405 may include supporting components, such as, e.g., drivers, for accessing the memory cells of the memory array. The tile may be partitioned into multiple sub-arrays, that may be referred to as "patches." Together the patches may define the larger repeating unit of a tile. In the example of FIG. 4A, four patches 410 (e.g., patches 410-*a*, 410-*b*, 410-*c*, and 410-*d*) correspond to tile 405. In other examples, a tile may include other quantities of patches, such as, e.g., 2, 4, 8, 12, 16 or 32 patches.

One or more drivers may be located substantially within a footprint of each patch, under the memory cells and near or at the periphery of the patch. For example, one or more word line drivers 415 and/or one or more bit line drivers 420 may be positioned on each patch 410. It will be understood that each shaded area may comprise a driver region that may include multiple driver circuits and so can represent a group of drivers. The row drivers, represented by word line drivers 415 in FIG. 4A may be elongated in the column or y-direction, while the column drivers, represented by bit line drivers 420 in FIG. 4A, may be elongated in the row or x-direction. A signal path traversing a path in an x- or y-direction may alternately pass over row and column driver regions.

Access lines (e.g., conductors or electrodes) may be included on each level for accessing the memory cells. For example, word line electrodes 425 and bit line electrodes 430 may be coupled with the memory cells positioned above the patches 410. The word line electrodes 425 may extend in one direction (e.g., the x-direction) and the bit line electrodes 430 may extend in a different direction (e.g., the y-direction).

The drivers may be electrically coupled with the access lines (e.g., access line electrodes). For example, word line drivers 415 and bit line drivers 420 may be electrically coupled with the word line electrodes 425 and the bit line electrodes 430, respectively. Because the drivers may be positioned along the periphery of the patches, the drivers may be coupled to the word line electrodes and bit line electrodes through interconnect regions 435, which may extend upward from the boundaries of the patches. The interconnect regions 435 may be referred to as socket regions. The array of memory cells directly above the interconnect regions 435 may have breaks to allow for vertical connectors through the interconnect regions 435 between the drivers and the electrodes.

A connection between a driver and an electrode may be known as a socket connection. The connection point, also known as a socket, between each access line electrode 425, 430 and its driver 415, 420 may be indicated by a dot along the electrode. The connection point (socket) may be positioned anywhere along the respective electrode. In some examples, the connection point (socket) may be positioned at an end of the electrode. In some examples, the connection point (socket) may be between either end of the electrode (e.g., a central location of the electrode). The word line electrodes and bit line electrodes may cross boundaries between adjacent patches and may also cross boundaries of other driver regions. In some examples, the word line electrodes 425 and bit line electrodes 430 may extend laterally beyond the outer boundaries (e.g., footprint) of the tile 405.

In some examples, the access line electrodes may be staggered or shifted. For example, adjacent word line electrodes 425 may be shifted with respect to one another along their axis of elongation (x-axis) and adjacent bit line electrodes 430 may be shifted with respect to one another along their axis of elongation (y-axis). By breaking the word and bit line driver groups and interconnect regions into smaller pieces and staggering the access line electrodes, or groups of access line electrodes, in alternate rows, as illustrated in FIG. 4A, the word line electrodes 425 and bit line electrodes 430 may extend through the memory array and through the interconnect regions 435. Accordingly, neither the interconnect regions nor the driver locations are restricted to the edges of the memory array.

The memory module 400-*b* illustrated in FIG. 4B may include a tile 450 formed on a substrate, according to one example. As with tile 405, tile 450 may be partitioned into multiple patches 410 having word line drivers 415 and bit line drivers 420. In the example of FIG. 4B, the tile 450 includes 16 patches 410 in a 4×4 arrangement. The patches 410 may be arranged in repeating patterns.

To access the memory cells positioned above the tile 450, word line electrodes 425 (e.g., word line electrodes 425-*a* through 425-*g*) and bit line electrodes 430 (e.g., bit line electrodes 430-*a* through 430-*g*, represented in FIG. 4B with dashed lines to differentiate from the word line electrodes 425) may be used. The word line electrodes 425-*a* through 425-*g* and bit line electrodes 430-*a* through 430-*g* may be considered to be coupled with the memory cells of the memory module 400-*b* for addressing each memory cell of tile 450. Similar to FIG. 4A, word line drivers 415 and bit line drivers 420 may be electrically coupled with word line electrodes 425 and bit line electrodes 430, respectively, via socket connections that pass through interconnect regions to connection points (sockets) represented by dots in the figure.

Further, many of the electrodes are configured to address and access memory cells corresponding to one of the tiles 455 along with tile 450. For example, word line electrodes 425-*b*, 425-*d*, and 425-*g* are illustrated as extending above tiles 450 and 455-*a*, for accessing memory cells of the two tiles. As such, the word line electrodes 425-*b*, 425-*d*, and 425-*g* may be considered to be coupled with one or more memory cells of a different memory tile than the memory tile including the drivers for addressing each memory cell of the tiles 450 and 455.

The tile 450 may be configured to couple with neighboring tiles 455 (e.g., tiles 455-*a*, 455-*b*, 455-*c*, and 455-*d*) to address and access memory cells of the memory array. Note that only a portion of each tile 455 is shown. In some examples, circuitry (e.g., decoders and amplifiers) positioned on neighboring tiles 455 may be configured to address and access memory cells positioned above the tile 450. For example, to address and access memory cells positioned above tile 450, word line electrodes 425-*d* and 425-*f* may be coupled with word line drivers 415 on neighboring tiles 455-*a* and 455-*c*, respectively; and bit line electrodes 430-*b* and 430-*d* may be coupled with bit line drivers 420 on neighboring tiles 455-*b* and 455-*d*, respectively. In this manner, a tile 450 may not be configured to be fully operational as a stand-alone unit. Rather, a tile 450 may rely on the circuitry of neighboring tiles 455 to provide full functionality to the tile 450. Remove any of the neighboring tiles 455 and one or more of the memory cells above tile 450 may be inaccessible.

If a tile of a cluster is positioned on the edge of the cluster, there may be no neighboring tile beyond that edge to provide an array termination function (e.g., access the memory cells using a driver thereon). As a result, one or more memory cells positioned above the edge tile may be inaccessible by the cluster. For example, if tile 450 is positioned on a right edge of a first cluster, the cluster may not include abutting tile 455-*a*. As a result, memory cells positioned above tile 450 and normally accessed by word line electrode 425-*d* of tile 455-*a* may be inaccessible by the first cluster. As another example, if tile 450 is positioned on a bottom edge of a cluster, the cluster may not include abutting tile 455-*b*. As a result, memory cells positioned above tile 450 and normally accessed by bit line electrode 430-*b* of tile 455-*b* may be inaccessible by the first cluster. In some examples, however, if the abutting tiles 455-*a* or 455-*b* are edge tiles of a second cluster that abuts the first cluster, the tiles may be used to address and access the memory cells from outside the first cluster (e.g., by the second cluster).

Figure 5:
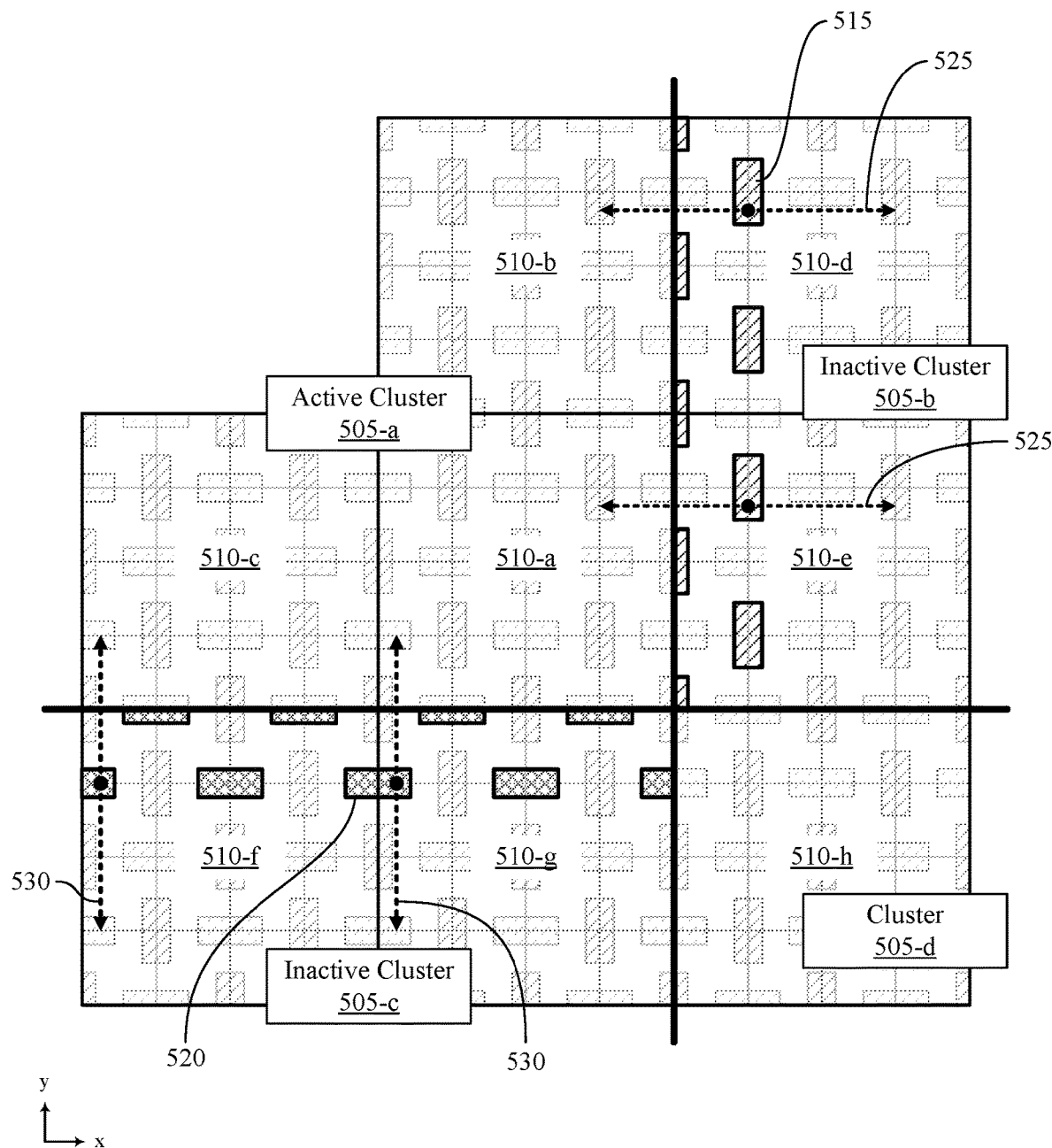
FIG. 5 illustrates a simplified plan view of a memory die that supports edgeless memory clusters in accordance with examples as disclosed herein.

FIG. 5 illustrates a simplified plan view of a memory die 500 that supports edgeless memory clusters in accordance with examples as disclosed herein. FIG. 5 illustrates one example of accessing memory cells of a cluster using tiles of one or more neighboring clusters. The memory die 500 may implement aspects of the system as described with reference to FIGS. 1-4. For example, memory die 500 may be an example of memory die 160 or 200 discussed with reference to FIGS. 1 and 2.

Memory die 500 may include memory partitioned into memory arrays corresponding to a plurality of clusters 505 (e.g., clusters 505-*a*, 505-*b*, 505-*c*, and 505-*d*). Each cluster 505 may include a plurality of tiles 510 in a repeating pattern. For example, cluster 505-*a* may include tiles 510-*a*, 510-*b*, and 510-*c*; cluster 505-*b* may include tiles 510-*d* and 510-*e*; cluster 505-*c* may include tiles 510-*f* and 510-*g*; and cluster 505-*c* may include tile 510-*h*. The tiles 510 may include electrodes, such as, e.g., word line electrodes 525 and bit line electrodes 530. (Only a few of the electrodes are shown on FIG. 5 for the sake of clarity). The tiles 510 may be examples of the tile 450 discussed with reference to FIG.

4B. The word line electrodes 525 and bit line electrodes 530 may be examples of the word line electrodes 425 and bit line electrodes 430 discussed with reference to FIG. 4B.

As discussed with reference to FIG. 4B, one or more memory cells positioned above an edge tile of a cluster may be inaccessible by the cluster due to a lack of an abutting tile that would typically provide an array termination function (e.g., access the memory cells using a driver thereon). In some examples, an array termination function for these memory cells may be provided by another cluster. This may allow the memory cells to be accessed from outside the cluster (e.g., by the other cluster). In some examples, the memory cells of a first cluster may be accessed using a driver on an edge tile of a second cluster that abuts the first cluster. For example, edge tiles 510-*d* and 510-*e* of cluster 505-*b* may include word line drivers 515 (highlighted in FIG. 5) that provide access to memory cells positioned above edge tiles 510-*a* and 510-*b* of abutting cluster 505-*a* via word line electrodes 525, and edge tiles 510-*f* and 510-*g* of cluster 505-*c* may include bit line drivers 520 (highlighted in FIG. 5) that provide access to memory cells positioned above edge tiles 510-*a* and 510-*c* of abutting cluster 505-*a* via bit line electrodes 530. As such, clusters 505-*b* and 505-*c* may provide an array termination function for cluster 505-*a*. Each overlapping electrode may be considered to be coupled with memory cells of more than one memory cluster. That is, each overlapping electrode may be considered to be an electrode of both memory clusters it overlaps.

Although not shown, it is appreciated that the array termination function may be provided both ways. That is, abutting clusters may provide an array termination function for each other. For example, edge tiles 510-*a*, 510-*b*, and 510-*c* of cluster 505-*a* may provide access to memory cells of tiles 510-*d*, 510-*e*, 510-*f*, and 510-*g* of clusters 505-*b* and 505-*c* (e.g., in the opposite direction) in a similar manner.

In this manner, memory cells of a cluster that may be inaccessible to the cluster may be accessible using tiles of a neighboring, abutting cluster. As a result, the gap between clusters may be eliminated without losing functionality of the memory. This may achieve substantial reduction in die size.

In some examples, edge tiles of a cluster may access memory cells of an abutting cluster in a similar manner that the tiles access memory cells positioned above abutting tiles in its own cluster (e.g., the tiles may use similar drivers connected to similar electrodes via similar socket connections in similar manners). For example, the tiles may use the same drivers (e.g., word line drivers 515 and bit line drivers 520) and electrodes (e.g., word line electrodes 525 and bit line electrodes 530) to access the neighboring cluster that it uses in its own cluster. This may reduce stress on the electrodes by reducing changes in density of the electrode layers.

In some examples, a driver may operate both for its own cluster and for a neighboring cluster using a same electrode. That is, a driver may provide access to memory cells of its cluster and provide an array termination function for an abutting cluster via a same electrode. In some examples, the driver may operate to access memory cells within its own cluster when the cluster is active and operate to provide an array termination for (e.g., access to memory cells within) a neighboring cluster when its own cluster is inactive. A driver may have different parameters when used to provide an array termination function as it does during normal operations. In some examples, a circuit (e.g., a multiplexer) may be coupled to the driver to control the driver (e.g., select which input signal to use) dependent on which cluster the driver is being used for at any given time.

In some examples, a first driver circuit may be configured to enable the driver to access one or more memory cells of its own cluster via an electrode, e.g., when the memory cluster is active. A second driver circuit may be configured to enable the driver to access one or more memory cells of the abutting memory cluster via the same electrode, e.g., when the abutting memory cluster is active.

A tile may include a plurality of drivers, some of which may be used to provide an array termination function for an abutting cluster. The plurality of drivers may be partitioned into a first portion, which may include the drivers that are not used to provide the array termination function and a second portion, which may include the drivers that are used to provide the array termination function. In some examples, the first and second portions of the tile may be active (e.g., usable) to access memory cells of the cluster when the cluster is active. The second portion of the tile may be active (e.g., usable) when the cluster is inactive to provide an array termination for (e.g., access to memory cells within) a neighboring cluster.

In some examples, a tile of a first cluster may be partitioned into first and second portions. The first portion of the tile may include, e.g., the first portion of drivers and the second portion of the tile may include, e.g., the second portion of drivers. Upon deciding to access memory cells of an abutting, second cluster, the first portion of the tile may be inhibited (e.g., the first portion of drivers may be disabled) and the second portion of the tile may be enabled to access the memory cells of the second cluster. When the first portion is inhibited, the tile may act as a termination tile for the second cluster and the second portion of drivers may be enabled. In some cases, the second portion of drivers may each be coupled with memory cells of both the first and second cluster via a same respective electrode. In those cases, the drivers may be activated to access, via the respective electrodes, the memory cells of the second cluster without accessing the memory cells of the first cluster.

In some examples, the abutting, second cluster may include similar tiles to the first cluster and may provide an array termination function for the first cluster in a similar manner. That way, each cluster may provide an array termination function (e.g., access memory cells using a driver thereon) for the other cluster In some examples, adjoining (abutting) clusters may be activated at mutually exclusive periods of time. That is, when a cluster may be in active mode, the clusters that abut that cluster may be inactive. For example, when cluster 505-*a* may be active, clusters 505-*b* and 505-*c* may be inactive. Cluster 505-*d* may be active or inactive because it does not about active cluster 505-*a*. When cluster 505-*b* or 505-*c* (or both) are active, cluster 505-*a* would be inactive. Cluster 505-*d* would be inactive because it abuts clusters 505-*b* and 505-*c*, at least one of which is active.

Activating adjoining clusters at mutually exclusive periods of time may isolate the active clusters from each other so that tiles within the inactive clusters may provide array termination functions for the active clusters. For example, edge tiles of the inactive clusters may be configured to behave as termination tiles for the edge tiles of the active clusters.

In some examples, the clusters may be assigned to different groups (domains) whose clusters do not abut one another and the domains may be active at different, mutually exclusive times.

Figure 6A:
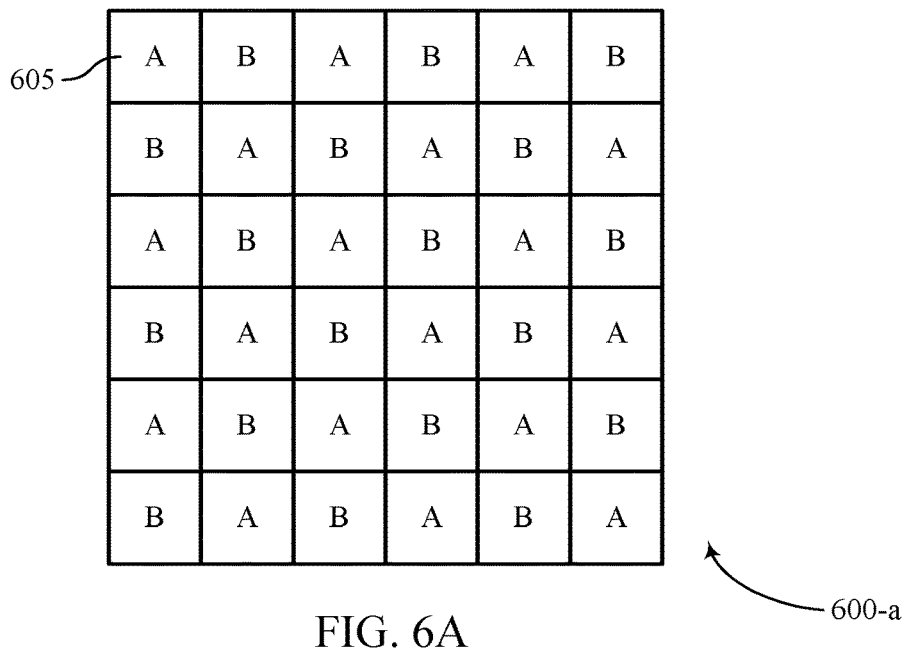
FIGS. 6A and 6B illustrate simplified plan views of memory dies that support edgeless memory clusters in accordance with examples as disclosed herein.
Figure 6B:
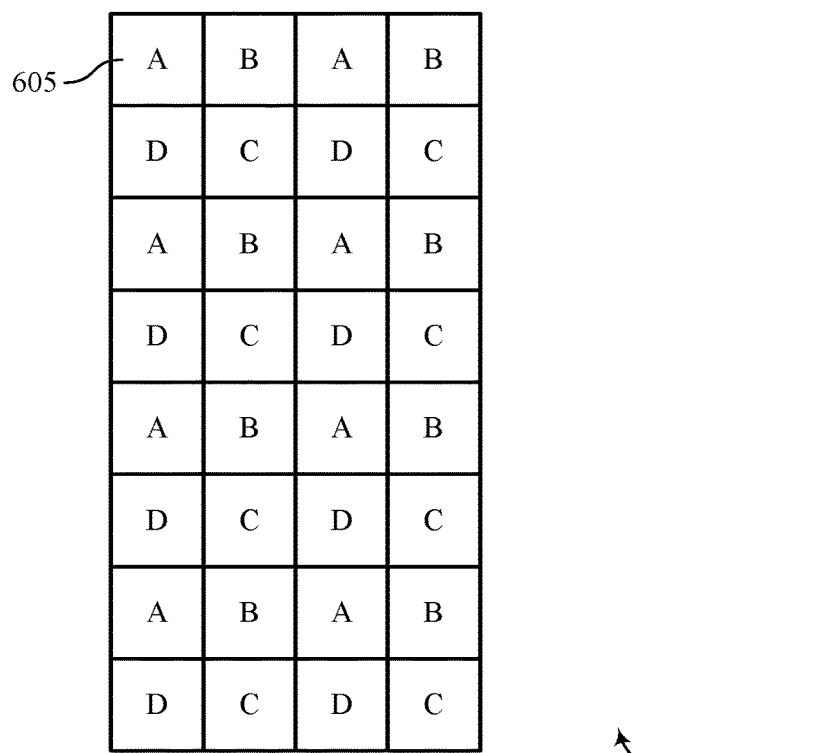

FIGS. 6A and 6B illustrate simplified plan views of memory dies 600-*a* and 600-*b* that support edgeless memory clusters in accordance with examples as disclosed herein. The dies may implement aspects of the system as described with reference to FIGS. 1-5. For example, the dies represented 600-*a* and 600-*b* may be examples of dies 160 or 200 discussed with reference to FIGS. 1 and 2. FIGS. 6A and 6B each illustrate a plurality of abutting clusters 605 of a die. The clusters 605 may be assigned to different groups (domains) based on their positions with respect to one another.

FIG. 6A illustrates a two-domain system in which each cluster 605 may be assigned to a first domain (denoted "A") or a second domain (denoted "B"). The assignment may be made so that clusters that abut each other are in different domains. That is, the clusters of domain A may not abut other clusters of domain A and the clusters of domain B may not abut other clusters of domain B. By assigning the clusters this way, clusters of one of the domains (e.g., domain A) may be in active mode at the same time (e.g., the domain may be active) and clusters of the other domain (e.g., domain B) may be inactive (e.g., the domain may be inactive), but may provide array termination functions for the active clusters. As long as the domains are active at mutually exclusive times, (e.g., not active at the same time), active clusters may be isolated from each other regardless of which domain is active.

FIG. 6B illustrates a four-domain system in which each cluster 605 may be assigned to one of four domains (denoted "A", "B", "C", and "D"). As with FIG. 6A, the assignment may be made so that clusters that abut each other are in different domains. As such, clusters of one of the domains (e.g., domain A) may be in active mode at the same time and clusters of the other domains (e.g., domains B, C, and D) may be inactive, but may provide array termination functions for the active clusters. As long as the domains are active at mutually exclusive times (i.e., one is active at a time), active clusters may be isolated from each other regardless of which domain is active. In some examples, the assignments may be made so that active clusters may be isolated from each other when more than one domain is active. For example, domains A and C of FIG. 6B may be concurrently active since none of the clusters of those domains abut one another. Similarly, the domains B and D may be concurrently active since none of the clusters of those domains abut one another.

Figure 7:
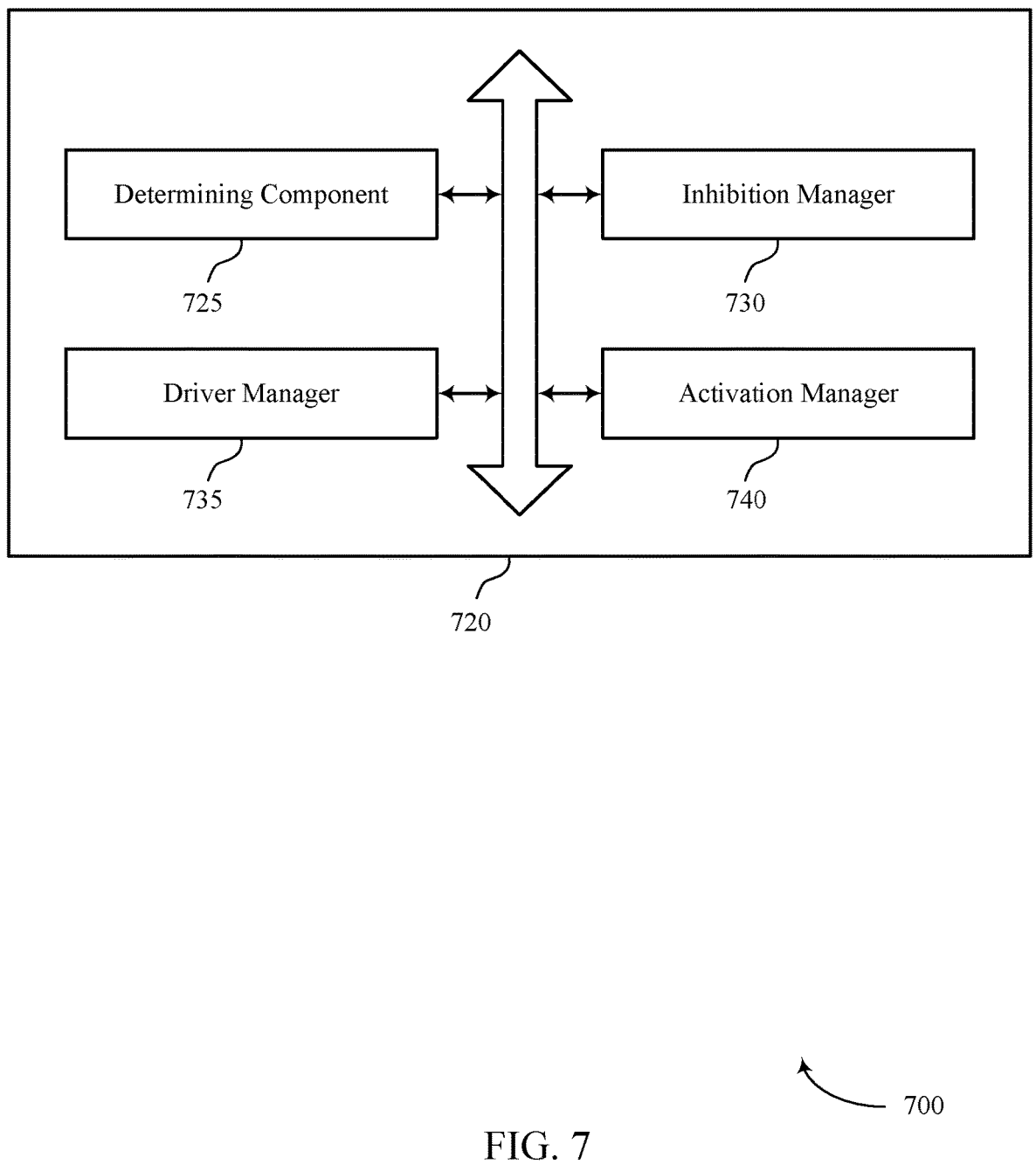
FIG. 7 shows a block diagram of a memory device that supports edgeless memory clusters in accordance with examples as disclosed herein.

FIG. 7 shows a block diagram 700 of a memory device 720 that supports edgeless memory clusters in accordance with examples as disclosed herein. The memory device 720 may be an example of aspects of a memory device as described with reference to FIGS. 1 through 6. The memory device 720, or various components thereof, may be an example of means for performing various aspects of edgeless memory clusters as described herein. For example, the memory device 720 may include a determining component 725, an inhibition manager 730, a driver manager 735, an activation manager 740, or any combination thereof. Each of these components may communicate, directly or indirectly, with one another (e.g., via one or more buses).

The determining component 725 may be configured as or otherwise support a means for determining to access a first memory array of a first memory cluster, the first memory cluster including a first plurality of tiles that include a first plurality of drivers coupled with the first memory array. The inhibition manager 730 may be configured as or otherwise support a means for inhibiting, based at least in part on determining to access the first memory array, a first portion of a tile of a second plurality of tiles of a second memory cluster in response to determining to access the first memory array of the first memory cluster, the second memory cluster including a second memory array, the second plurality of tiles including a second plurality of drivers coupled with the second memory array, a driver of the second plurality of drivers coupled with the first memory array and positioned on a second portion of the tile. The driver manager 735 may be configured as or otherwise support a means for enabling, based at least in part on determining to access the first memory array, the driver on the second portion of the tile of the second memory cluster to access the first memory array of the first memory cluster.

In some examples, the second portion of the tile may act as a termination tile for the first memory cluster when the first portion of the tile is inhibited.

In some examples, the activation manager 740 may be configured as or otherwise support a means for deactivating the second memory cluster before enabling the driver on the second portion of the tile of the second memory cluster.

In some examples, the driver may be coupled with one or more memory cells of the first memory array and one or more memory cells of the second memory array via a same electrode.

In some examples, to support enabling the driver on the second portion of the tile of the second memory cluster, the activation manager 740 may be configured as or otherwise support a means for activating the driver to access, via the electrode, the one or more memory cells of the first memory array without accessing the one or more memory cells of the second memory array.

In some examples, to support inhibiting the first portion of the tile of the second plurality of tiles, the driver manager 735 may be configured as or otherwise support a means for disabling one or more drivers of the first portion of the tile.

In some examples, the determining component 725 may be configured as or otherwise support a means for determining to access the second memory array of the second memory cluster. In some examples, the inhibition manager 730 may be configured as or otherwise support a means for inhibiting a first portion of a second tile of the first plurality of tiles of the first memory cluster in response to determining to access the second memory array of the second memory cluster, a second driver of the first plurality of drivers further coupled with the second memory array and positioned on a second portion of the second tile. In some examples, the driver manager 735 may be configured as or otherwise support a means for enabling the second driver on the second portion of the second tile of the first memory cluster to access the second memory array of the second memory cluster.

Figure 8:
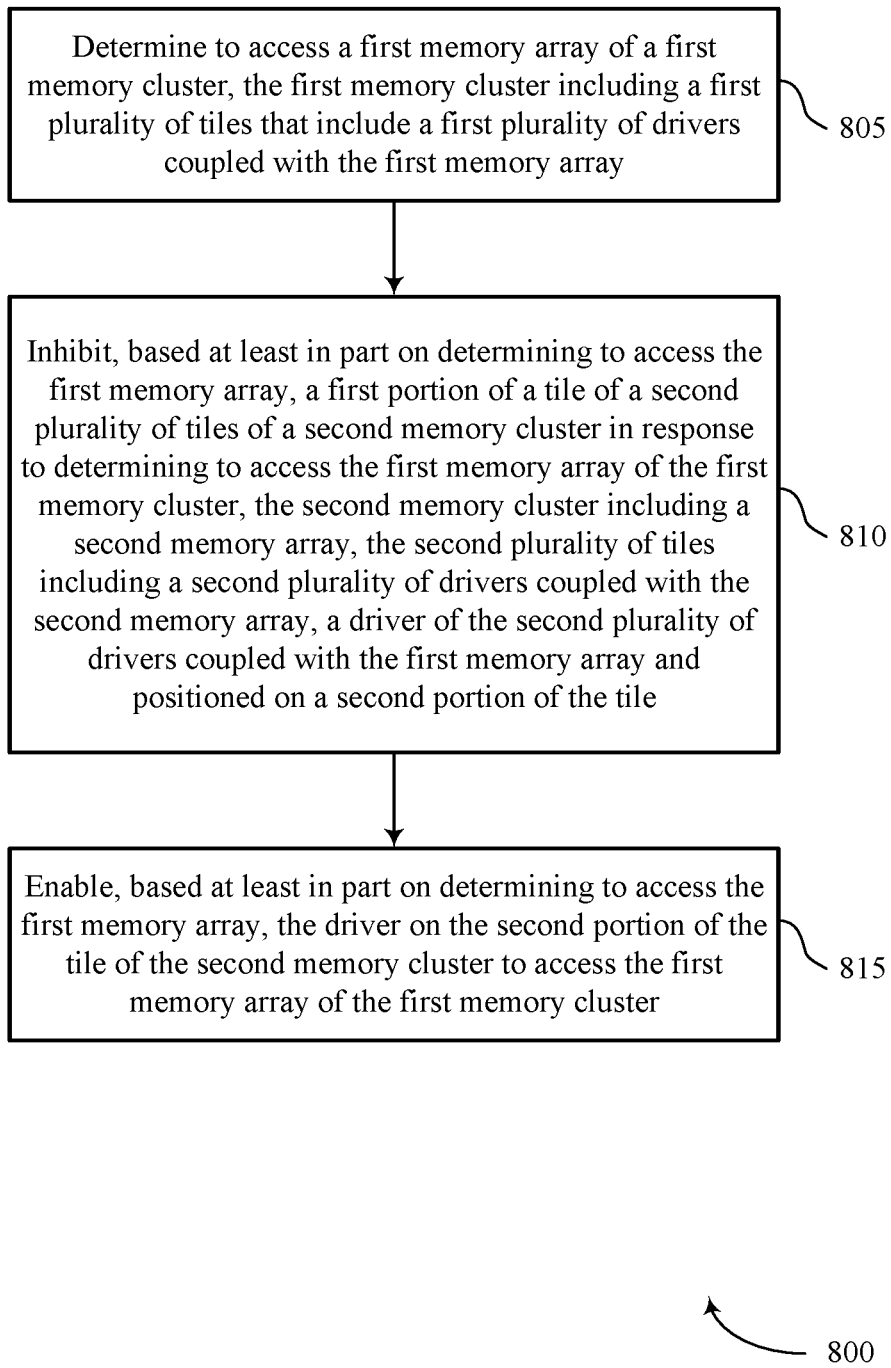
FIG. 8 shows a flowchart illustrating a method that supports edgeless memory clusters in accordance with examples as disclosed herein.

FIG. 8 shows a flowchart illustrating a method 800 that supports edgeless memory clusters in accordance with examples as disclosed herein. The operations of method 800 may be implemented by a memory device or its components as described herein. For example, the operations of method 800 may be performed by a memory device as described with reference to FIGS. 1 through 7. In some examples, a memory device may execute a set of instructions to control the functional elements of the device to perform the described functions. Additionally or alternatively, the memory device may perform aspects of the described functions using special-purpose hardware.

At 805, the method may include determining to access a first memory array of a first memory cluster, the first memory cluster including a first plurality of tiles that include a first plurality of drivers coupled with the first memory array. The operations of 805 may be performed in accordance with examples as disclosed herein. In some examples, aspects of the operations of 805 may be performed by a determining component 725 as described with reference to FIG. 7.

At 810, the method may include inhibiting, based at least in part on determining to access the first memory array, a first portion of a tile of a second plurality of tiles of a second memory cluster in response to determining to access the first memory array of the first memory cluster, the second memory cluster including a second memory array, the second plurality of tiles including a second plurality of drivers coupled with the second memory array, a driver of the second plurality of drivers coupled with the first memory array and positioned on a second portion of the tile. The operations of 810 may be performed in accordance with examples as disclosed herein. In some examples, aspects of the operations of 810 may be performed by an inhibition manager 730 as described with reference to FIG. 7.

At 815, the method may include enabling, based at least in part on determining to access the first memory array, the driver on the second portion of the tile of the second memory cluster to access the first memory array of the first memory cluster. The operations of 815 may be performed in accordance with examples as disclosed herein. In some examples, aspects of the operations of 815 may be performed by a driver manager 735 as described with reference to FIG. 7.

In some examples, an apparatus as described herein may perform a method or methods, such as the method 800. The apparatus may include, features, circuitry, logic, means, or instructions (e.g., a non-transitory computer-readable medium storing instructions executable by a processor) for determining to access a first memory array of a first memory cluster, the first memory cluster including a first plurality of tiles that include a first plurality of drivers coupled with the first memory array, inhibiting, based at least in part on determining to access the first memory array, a first portion of a tile of a second plurality of tiles of a second memory cluster in response to determining to access the first memory array of the first memory cluster, the second memory cluster including a second memory array, the second plurality of tiles including a second plurality of drivers coupled with the second memory array, a driver of the second plurality of drivers coupled with the first memory array and positioned on a second portion of the tile, and enabling, based at least in part on determining to access the first memory array, the driver on the second portion of the tile of the second memory cluster to access the first memory array of the first memory cluster.

In some examples of the method 800 and the apparatus described herein, the second portion of the tile may act as a termination tile for the first memory cluster when the first portion of the tile may be inhibited.

Some examples of the method 800 and the apparatus described herein may further include operations, features, circuitry, logic, means, or instructions for deactivating the second memory cluster before enabling the driver on the second portion of the tile of the second memory cluster.

In some examples of the method 800 and the apparatus described herein, the driver may be coupled with one or more memory cells of the first memory array and one or more memory cells of the second memory array via a same electrode.

In some examples of the method 800 and the apparatus described herein, enabling the driver on the second portion of the tile of the second memory cluster may include operations, features, circuitry, logic, means, or instructions for activating the driver to access, via the electrode, the one or more memory cells of the first memory array without accessing the one or more memory cells of the second memory array.

In some examples of the method 800 and the apparatus described herein, inhibiting the first portion of the tile of the second plurality of tiles may include operations, features, circuitry, logic, means, or instructions for disabling one or more drivers of the first portion of the tile.

Some examples of the method 800 and the apparatus described herein may further include operations, features, circuitry, logic, means, or instructions for determining to access the second memory array of the second memory cluster, inhibiting a first portion of a second tile of the first plurality of tiles of the first memory cluster in response to determining to access the second memory array of the second memory cluster, a second driver of the first plurality of drivers further coupled with the second memory array and positioned on a second portion of the second tile, and enabling the second driver on the second portion of the second tile of the first memory cluster to access the second memory array of the second memory cluster.

It should be noted that the methods described herein describe possible implementations, and that the operations and the steps may be rearranged or otherwise modified and that other implementations are possible. Furthermore, portions from two or more of the methods may be combined.

An apparatus is described. The apparatus may include a set of memory clusters, each memory cluster of the set of memory clusters including a plurality of tiles having drivers, a memory array positioned above the plurality of tiles and having a plurality of memory cells, a plurality of electrodes coupled with the plurality of memory cells for addressing each memory cell of the plurality of memory cells, where a driver of a first tile of a first memory cluster of the set of memory clusters is coupled with an electrode of the plurality of electrodes of a second tile of a second memory cluster of the set of memory clusters, and where the first memory cluster and the second memory cluster are configured to operate in an active mode during mutually exclusive periods of time.

In some examples of the apparatus, the set of memory clusters may include a first subset of memory clusters that do not abut each other and a second subset of memory clusters that do not abut each other, the second subset not including the memory clusters of the first subset, where the apparatus may be configured such that the memory clusters of the second subset operate in an inactive mode when the memory clusters of the first subset operate in the active mode.

In some examples of the apparatus, the first subset of memory clusters includes the first memory cluster and the second subset of memory clusters includes the second memory cluster.

In some examples of the apparatus, the set of memory clusters further includes a third subset of memory clusters that do not abut each other, the third subset not including the memory clusters of the first and second subsets.

In some examples of the apparatus, the first memory cluster abuts the second memory cluster.

In some examples of the apparatus, each memory cluster of the set abuts another memory cluster of the set.

In some examples of the apparatus, the apparatus may be configured such that memory clusters of the set that abut each other do not operate in the active mode at the same time.

In some examples of the apparatus, for each memory cluster of the set, tiles of the plurality of tiles may have a common configuration of drivers and may be positioned in a repeating pattern.

In some examples of the apparatus, for each memory cluster of the set, the electrodes of the plurality of electrodes may be coupled with the drivers via respective socket connections.

In some examples of the apparatus, one or more electrodes of the plurality of electrodes of the first memory cluster may be also in the plurality of electrodes of the second memory cluster.

In some examples of the apparatus, one or more electrodes may be each included in the plurality of electrodes of more than one memory cluster of the set.

Another apparatus is described. The apparatus may be a memory cluster. The memory cluster may include a plurality of tiles having drivers, a memory array positioned above the plurality of tiles and having a plurality of memory cells, a plurality of electrodes coupled with the drivers via respective socket connections, the plurality of electrodes coupled with the plurality of memory cells for addressing each memory cell of the plurality of memory cells, and where a tile of the plurality of tiles includes a first portion of the drivers and a second portion of the drivers, the second portion of the drivers configured to be used when the memory cluster is inactive for accessing memory cells of an abutting memory cluster.

In some examples of the apparatus, each driver of the second portion of the drivers includes a first driver circuit configured to enable the driver to access one or more memory cells of the plurality of memory cells via an electrode of the plurality of electrodes and a second driver circuit configured to enable the driver to access one or more memory cells of the abutting memory cluster via the electrode of the plurality of electrodes.

In some examples of the apparatus, the first portion of the drivers may be configured to be used for accessing one or more memory cells of the memory cluster when the abutting memory cluster may be inactive.

In some examples of the apparatus, tiles of the plurality of tiles may have a common configuration of drivers and may be positioned in a repeating pattern.

Another apparatus is described. The apparatus may include a first memory cluster, including a first memory array having a first plurality of memory cells, a first driver coupled with a subset of the first plurality of memory cells, and a first driver circuit configured to enable the first driver when the first memory cluster is active and a second memory cluster, including a second memory array having a second plurality of memory cells, where the first driver is coupled with at least one memory cell of the second plurality of memory cells and a second driver coupled with a subset of the second plurality of memory cells, where the first driver circuit is further configured to enable the first driver when the second memory cluster is active and the first memory cluster is inactive.

In some examples of the apparatus, the first memory cluster abuts the second memory cluster.

In some examples, the apparatus may include an electrode that couples the first driver with the subset of the first plurality of memory cells and the second driver with the subset of the second plurality of memory cells.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, and/or materials. In some examples, one layer or level may be composed of two or more sublayers or sublevels.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   determining to access a first memory cell of a first memory cluster, the first memory cluster including a first plurality of tiles;
   activating a driver to access the first memory cell of the first memory cluster, the driver positioned in a tile of the first plurality of tiles of the first memory cluster;
   determining to access a second memory cell of a second memory cluster, the second memory cluster adjacent to the first memory cluster and including a second plurality of tiles that are different than the first plurality of tiles; and
   activating the driver of the first memory cluster to access the second memory cell of the second memory cluster.

2. The method of claim 1, further comprising:
   deactivating the first memory cluster before activating the driver to access the second memory cell of the second memory cluster.

3. The method of claim 1, further comprising:
   deactivating the second memory cluster before activating the driver to access the first memory cell of the first memory cluster.

4. The method of claim 1, wherein the driver is coupled with the first memory cell of the first memory cluster and the second memory cell of the second memory cluster via a same access line.

5. The method of claim 4, wherein activating the driver to access the first memory cell of the first memory cluster comprises:
   activating the driver to access, via the access line, the first memory cell of the first memory cluster without accessing the second memory cell of the second memory cluster.

6. The method of claim 5, wherein activating the driver to access the second memory cell of the second memory cluster comprises:
   activating the driver to access, via the access line, the second memory cell of the second memory cluster without accessing the first memory cell of the first memory cluster.

7. The method of claim 1, wherein the tile of the first memory cluster abuts the second memory cluster.

8. The method of claim 1, the driver including a first driver circuit configured to enable the driver to access the first memory cell of the first memory cluster and a second driver circuit configured to enable the driver to access the second memory cell of the second memory cluster.

9. The method of claim 8, wherein the first driver circuit and the second driver circuit are configured to enable the driver to access the first and second memory cells via a same access line.

10. The method of claim 1 further comprising inhibiting, based at least in part on determining to access the second memory cell of the second memory cluster, a first portion of the tile of the first memory cluster.

11. A memory cluster, comprising:
    a plurality of tiles;
    a driver positioned in a tile of the plurality of tiles; and
    a memory cell positioned above the plurality of tiles, wherein the driver is configured to access the memory cell of the memory cluster and a memory cell of an abutting memory cluster at mutually exclusive periods of time.

12. The memory cluster of claim 11, further comprising an access line coupled with the driver via a socket connection, wherein the driver is further configured to access the memory cell of the memory cluster and the memory cell of the abutting memory cluster via the access line.

13. The memory cluster of claim 12, wherein the driver comprises:
    a first driver circuit configured to enable the driver to access the memory cell of the memory cluster via the access line; and
    a second driver circuit configured to enable the driver to access the memory cell of the abutting memory cluster via the access line.

14. The memory cluster of claim 11, wherein the driver is configured to access the memory cell of the memory cluster when the abutting memory cluster is inactive.

15. The memory cluster of claim 11, wherein the plurality of tiles are positioned in a repeating pattern.

16. An apparatus, comprising:
    a first memory cluster, comprising:
       a first memory cell;
       a first driver coupled with the first memory cell; and
       a first driver circuit configured to enable the first driver when the first memory cluster is active; and
    a second memory cluster, comprising:
       a second memory cell, coupled with the first driver of the first memory cluster, wherein the first driver circuit is further configured to enable the first driver when the second memory cluster is active and the first memory cluster is inactive.

17. The apparatus of claim 16, further comprising:
    an access line that couples the first driver with the first memory cell and the second memory cell.

18. The apparatus of claim 16, wherein the second memory cluster further comprises:
    a second driver coupled with a third memory cell of the first memory cluster and a fourth memory cell of the second memory cluster; and
    a second driver circuit configured to:
       enable the second driver when the second memory cluster is active; and
       enable the second driver when the first memory cluster is active and the second memory cluster is inactive.

19. The apparatus of claim 16, wherein the first memory cluster abuts the second memory cluster.

20. The apparatus of claim 16, further comprising:
    an access line that couples the first driver with the first memory cell and the second driver with the second memory cell.

* * * * *